(12) United States Patent
Babcock et al.

(10) Patent No.: US 6,927,428 B2
(45) Date of Patent: Aug. 9, 2005

(54) LATERAL HETEROJUNCTION BIPOLAR TRANSISTOR

(75) Inventors: Jeffrey A. Babcock, Richardson, TX (US); Angelo Pinto, Allen, TX (US); Gregory E. Howard, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/818,931

(22) Filed: Apr. 6, 2004

(65) Prior Publication Data

US 2004/0188802 A1 Sep. 30, 2004

Related U.S. Application Data

(62) Division of application No. 10/313,349, filed on Dec. 6, 2002, now Pat. No. 6,794,237.
(60) Provisional application No. 60/342,267, filed on Dec. 27, 2001.

(51) Int. Cl.⁷ ............................................. H01L 29/737
(52) U.S. Cl. ...................... 257/197; 257/347; 257/588
(58) Field of Search ................................. 257/197, 347, 257/587–588

(56) References Cited

U.S. PATENT DOCUMENTS

| | | | | |
|---|---|---|---|---|
| 5,198,689 A | * | 3/1993 | Fujioka | ....................... 257/197 |
| 6,177,717 B1 | * | 1/2001 | Chantre et al. | ............. 257/565 |
| 6,465,316 B2 | * | 10/2002 | Hattori et al. | .............. 438/311 |
| 2002/0158313 A1 | * | 10/2002 | Takagi et al. | ................ 257/593 |

OTHER PUBLICATIONS

Vasudev,et at, "Advanced Materials for Low Power Electronics", *Solid State Electronics*, vol. 39, No. 4, (1996), pp. 489–497.

Huang, et al, "TFSOI BiCMOS Technology for Low Power Applications", *IEDM Technical Digest*, (1993), pp. 449–452.

Hwang, et al, "Design and Manufacturing Considerations of a 0.5 um CMOS Technology on TFSOI", *IEEE International SOI Conference Proceedings*, (1993), pp. 128–129.

El-Kareh, et al, "Silicon On Insulator–An Emerging High–Leverage Technology", *IEEE Trans. Components, Packaging & Manufacturing Technology–Part A*, vol. 18, No. 1, (1995), pp. 187–194.

(Continued)

*Primary Examiner*—Allan R. Wilson
(74) *Attorney, Agent, or Firm*—Yingsheng Tung; Wade James Brady, III; Frederick J. Telecky, Jr.

(57) ABSTRACT

A heterojunction bipolar transistor (30) in a silicon-on-insulator (SOI) structure is disclosed. The transistor collector (28), heterojunction base region (20), and intrinsic emitter region (25) are formed in the thin film silicon layer (6) overlying the buried insulator layer (4). A base electrode (10) is formed of polysilicon, and has a polysilicon filament (10f) that extends over the edge of an insulator layer (8) to contact the silicon layer (6). After formation of insulator filaments (12) along the edges of the base electrode (10) and insulator layer (8), the thin film silicon layer (6) is etched through, exposing an edge. An angled ion implantation then implants the heterojunction species, for example germanium and carbon, into the exposed edge of the thin film silicon layer (6), which after anneal forms the heterojunction base region (20). Polysilicon plugs for the emitter (24e) and collector (24c) are then formed, from which dopant diffuses to form the intrinsic emitter (25) and subcollector (22) of the device.

7 Claims, 5 Drawing Sheets

OTHER PUBLICATIONS

Huang, et al, "TFSOI Complementary BiCMOS Technology for Low Power Applications", *IEEE Transactions on Electron Devices*, vol. 42, No. 3, (Mar., 1995), pp. 506–512.

Shahidi, et al, "A Novel High–Performance Lateral Bipolar on SOI", *IEDM* (IEEE, 1991), pp. 663–666.

Dekker, et al, "An Ultra Low Power Lateral Bipolar Polysilicon Emitter Technology on SOI", *IEDM Technical Digest*, (IEEE, 1993), pp. 75–78.

Dekker, et al, "An ultra Low–Power RF Bipolar Technology on Glass", *IEDM Technical Digest*, (1997), pp. 921–923.

Chen, et al, "A Low Thermal Budget, Fully Self–Aligned Lateral BJT on Thin Film SOI Substrate for Low Power BiCMOS Applications", *Symposium VLSI Tech. Dig.*, (1995), pp. 133–134, no month cited.

Kawanaka, et al, "3–D Simulation Analysis of High Performance SOI Lateral BJT for RF Applications", *Proceedings of IEEE International SOI Conference*, (Oct. 1998), pp. 29–30.

Shino, et al, "A 31 GHz fmax Lateral BJT on SOI Using Self–Aligned External Base Formation Technology", *IEDM Technical Digest*, (IEEE, 1998), pp. 953–956, no month cited.

Nii, et al, "A 67 GHz fmax Lateral Bipolar Transistor with Co–silicided Base Electrode Structure on Thin Film SOI for RF Analog Applications", *Proc. ESSDREC '99*, pp. 212–215, 1999, no month cited.

Schlueter, "Trench Warfare: CMP and Shallow Trench Isolation", *Semiconductor International*, (Oct., 1999) pp. 123–130, no month cited.

* cited by examiner

LATERAL HETEROJUNCTION BIPOLAR TRANSISTOR

CROSS-REFERENCE TO RELATED APPLICATIONS

This is a divisional application of Ser. No. 10/313,349 filed Dec. 6, 2002, now U.S. Pat. No. 6,794,237, which claims priority under 35 USC 119(e) of provisional application Ser. No. 60/342,267 filed Dec. 27, 2001.

STATEMENT REGARDING FEDERALLY SPONSORED RESEARCH OR DEVELOPMENT

Not applicable

BACKGROUND OF THE INVENTION

This invention is in the field of semiconductor integrated circuits, and is more specifically directed to the low-cost fabrication of heterojunction bipolar silicon-on-insulator (SOI) integrated circuits.

As is well known in the art, the emitter injection efficiency, or simply emitter efficiency, of a bipolar transistor is a significant factor in the switching speed of the device. Emitter efficiency is generally defined as the ratio of electron current to hole current across the forward-biased emitter-base junction. In general, for "homojunction" transistors, which are transistors formed of a single material, the emitter injection efficiency is effectively proportional to the ratio of dopant concentration in the emitter region to the dopant concentration in the base region. However, this ratio is limited by such other factors as junction breakdown voltage, and the requirements for high Early voltages.

A method of improving this injection efficiency is to replace the conventional emitter-base homojunction with a heterojunction, in which the emitter material is different from that of the base. In conventional heterojunction devices, this difference has the effect of reducing the energy barrier to carriers that are injected from the emitter into the base region, thus improving emitter efficiency. In addition, conventional heterojunction devices are constructed so that a built-in electric field is present in the base region. This built-in field assists in carrier transport across the base region from the emitter to the collector, reducing the cutoff frequency $f_T$ of the device and improving the switching performance of the device. Examples of materials used in conventional heterojunction devices include gallium arsenide, gallium-aluminum arsenide, indium-phosphorous, other periodic group III–V material pairs, and these materials combined with silicon (e.g., silicon-gallium-arsenide).

Another conventional heterojunction bipolar transistor is formed in silicon, with an emitter is formed of silicon and a base is formed of a silicon-germanium alloy. Because the silicon-germanium structure has a narrower band gap than silicon, this heterojunction device has improved carrier injection efficiency from the emitter into the base, resulting in higher current gain. The high-frequency characteristics of the heterojunction device can be improved by grading the germanium profile in the silicon-germanium base, providing a built-in electric field that sweeps minority carriers through the base to the collector. It has been observed that silicon-germanium devices can provide comparable performance as GaAs in devices such as power amplifiers, at the added benefit of a substantial reduction in manufacturing cost.

However, conventional manufacturing processes for forming heterojunction devices of reasonable performance are very costly. For example, molecular beam epitaxy is generally used for many materials, such as gallium arsenide and the like. In the case of silicon-germanium heterojunction devices, the silicon-germanium films are formed by epitaxial growth from an underlying silicon layer. Such epitaxy is quite difficult and costly, especially considering the differences in lattice constant between silicon and germanium. Detrimental effects of this lattice mismatch between the silicon-germanium and the silicon substrate is also often present in these conventional methods, include high leakage current and low breakdown, especially as the germanium content in the silicon-germanium increases and the critical thickness decreases.

By way of further background, silicon-on-insulator (SOI) technology has also proven to be advantageous for high performance transistors. As is well-known in the art, SOI devices are formed in a relatively thin layer of single-crystal silicon overlying an insulating layer, such as silicon dioxide. The presence of the insulating layer largely eliminates the presence of junction capacitance, most importantly for transistor collectors, in the bipolar context. In conventional bulk devices, significant capacitance is present at the reverse-biased p-n junction between the transistor collector and the underlying substrate. In contrast, there is no p-n junction surrounding the collector in an SOI device; rather, the collector region interfaces with the underlying insulator film. Because the underlying insulator is relatively thick, little parasitic capacitance is presented to the device collector, and the switching speed of the SOI transistor is improved accordingly.

By way of further background, U.S. Pat. No. 5,583,059 describes a heterojunction transistor formed on in an SOI structure. According to this approach, the emitter and silicon-germanium base are arranged in vertical fashion, in connection with an extremely thin lateral collector. According to this reference, the silicon-germanium base is grown by epitaxy.

BRIEF SUMMARY OF THE INVENTION

It is therefore an object of the present invention to provide a low-cost method of fabricating a heterojunction transistor in a silicon-on-insulator structure.

It is a further object of this present invention to provide a lateral heterojunction bipolar transistor in a silicon-on-insulator structure.

It is a further object of this invention to provide such a method and transistor in which the device can be formed into a very thin silicon film overlying the insulator layer.

It is a further object of this invention to provide such a method that utilizes relatively few photolithography operations.

It is a further object of this invention to provide such a method that is compatible with the formation of metal-oxide-semiconductor transistors in the same silicon-on-insulator structure.

Other objects and advantages of the present invention will be apparent to those of ordinary skill in the art having reference to the following specification together with its drawings.

The present invention may be implemented in a heterojunction bipolar transistor, and a method of forming the same, on a silicon-on-insulator film, in which germanium and carbon are implanted into the silicon film under a sidewall base contact. The implant forms a heterojunction base region that is laterally disposed between emitter and collector regions. The sidewall base contact connects the underlying silicon film to an overlying polysilicon electrode, which provides an external base transistor terminal for the device.

DETAILED DESCRIPTION OF THE INVENTION

The present invention will now be described in connection with its preferred embodiments. These exemplary embodiments are directed to the fabrication of a heterojunction bipolar transistor in a silicon-on-insulator (SOI) structure. It will be appreciated by those skilled in the art having reference to this specification that the present invention may be used to form either PNP or NPN transistors, or both as may be used in a complementary bipolar or BiCMOS technology, as well as used to form other alternative structures. Furthermore, while these embodiments are SiGe and SiGeC (silicon-germanium-carbon) NPN and PNP bipolar transistors, it is contemplated that the present invention will be equally applicable to other heterojunction devices. It is therefore to be understood that these and other alternatives to the embodiments described below are contemplated to be within the scope of the invention as claimed.

Figure 1:
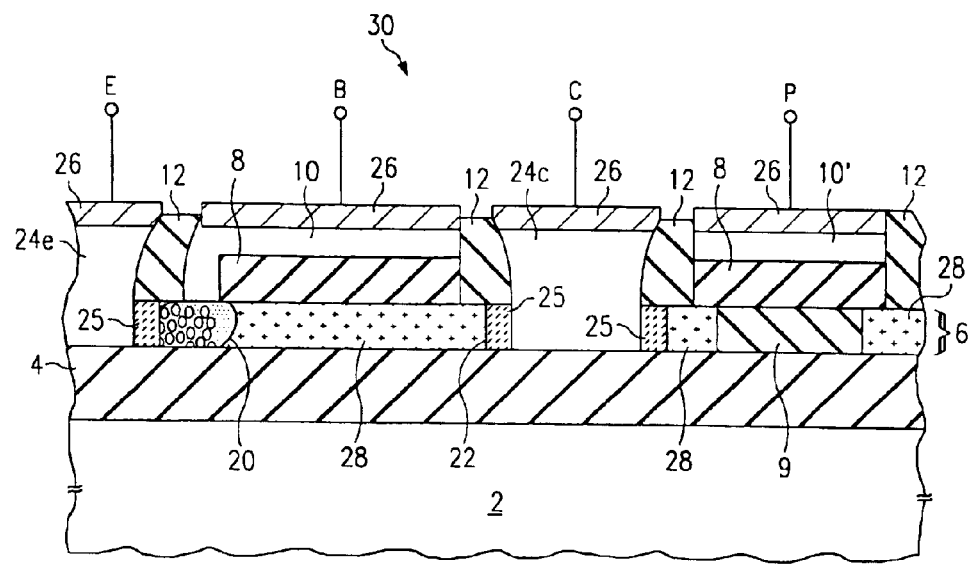
FIG. 1 is a cross-sectional view of a heterojunction bipolar transistor according to the preferred embodiment of the invention.
Figure 2:
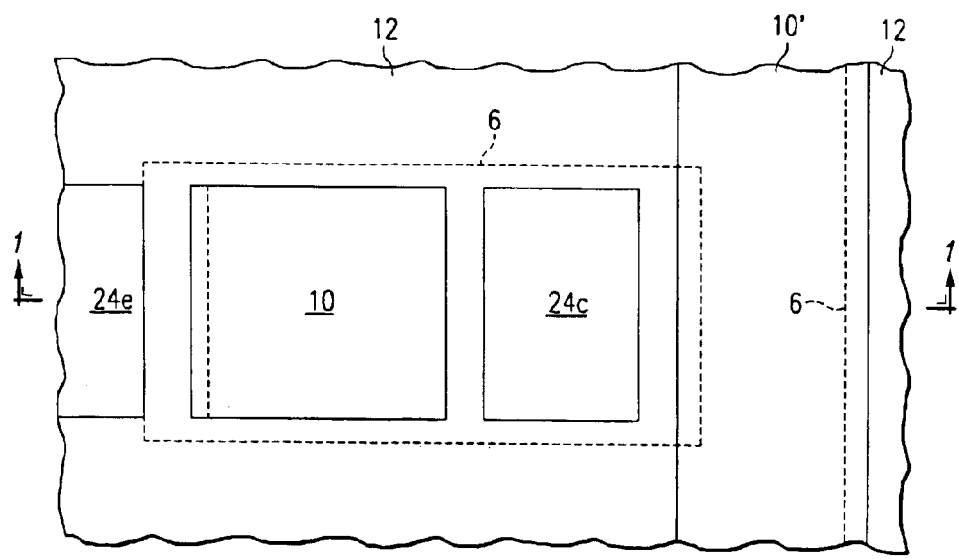
FIG. 2 is a plan view of the heterojunction bipolar transistor of FIG. 1, according to the preferred embodiment of the invention.

Referring now to FIGS. 1 and 2, the construction of heterojunction bipolar transistor 30 according to the preferred embodiment of the invention will now be described. According to the usual bipolar configuration, transistor 30 includes the electrical terminals emitter electrode E, collector electrode C, and base electrode B. In transistor 30, emitter electrode E is realized by emitter polysilicon plug 24e, base electrode B is realized by base polysilicon 10, and collector electrode C is realized by collector polysilicon plug 24c; in this embodiment of the invention, each of polysilicon elements 10, 24c, 24e are clad with a silicide film 26, for improved conductivity. Unrelated polysilicon electrode P is also shown in FIG. 1, to illustrate the position of an unrelated polysilicon conductor 10' near to transistor 30.

In the cross-section of FIG. 1, buried insulator layer 4 is present over substrate, or handle wafer, 2 in the typical manner for silicon-on-insulator (SOI) structures. Buried insulator layer 4 is typically silicon dioxide, and as such is generally referred to as buried oxide. Single-crystal silicon thin film layer 6 is disposed over buried insulator layer 4, and includes active emitter region 25, heterojunction base region 20, collector 28, and subcollector 22, the formation of each of which will be described in detail below. Polysilicon base electrode 10 contacts heterojunction base region 20, extends over collector region 28 in silicon thin film layer 6, and is insulated from collector region 28 by insulator layer 8. Base electrode 10 is isolated from emitter and collector polysilicon plugs 24c, 24e by insulator portions 12. Transistor 30 is isolated from other structures, such as unrelated polysilicon electrode 10', by trench isolation structures 9 that are formed at etched locations of silicon thin film layer 6.

FIG. 2 illustrates transistor 30 according to this example, in plan view. Silicide film 26 is not shown in FIG. 2, for clarity. As evident from FIG. 2, transistor 30 has a rectangular shape, although other geometries may of course be alternatively implemented. In this example, unrelated polysilicon electrode 10' extends to locations away from transistor 30, for example serving as a conductor within the integrated circuit containing transistor 30. Insulator portions 12 separate the elements of collector polysilicon plug 24c, emitter polysilicon plug 24e, base electrode 10, and unrelated polysilicon electrode 10' from one another, maintaining electrical integrity of the device. Also as shown in FIG. 2, the boundary of remaining portions of silicon thin film layer 6 extends away from the location of collector polysilicon plug 24c, emitter polysilicon plug 24e, base electrode 10.

Referring back to FIG. 1, the active portions of transistor 30 are substantially contained within silicon thin film layer 6. Active emitter region 25 is a portion of silicon thin film layer 6 into which dopant has diffused from emitter polysilicon plug 24e; similarly, subcollector 22 is a portion of silicon thin film layer 6 into which dopant has diffused from collector polysilicon plug 24c. Heterojunction base region 20, as will be described below is a portion of silicon thin film layer 6 into which ions other than silicon are present, forming a heterojunction region. In this example, heterojunction base region 20 is a portion of silicon thin film layer 6 into which germanium and carbon is present, forming a region of $Si_xGe_yC_{1-x-y}$. As known in the art, a heterojunction device relies on the difference in energy gap between materials. As such, heterojunction base region 20 in transistor 30 has a sufficient concentration of germanium and carbon to define a different energy gap from that of active emitter 25. Collector region 28 is a relatively lightly-doped portion of silicon thin film layer 6, disposed between base region 20 and subcollector 22. In the well-known manner, emitter region 25, collector 28 and subcollector 22 are all doped to one conductivity type, while base region 20 is doped to the opposite conductivity type. Depending on the particular doping, therefore, transistor 30 may be either an NPN device or a PNP device.

In operation, for the example of transistor 30 as an NPN device, base electrode B is biased to a voltage above that of emitter electrode E, so as to forward bias the emitter-base junction at the interface between active emitter region 25 and heterojunction base region 20. Collector electrode C is biased to a higher voltage than emitter electrode E (and base electrode B), establishing a strong reverse-bias electric field at the junction between collector 28 and base region 20. Electrons that are drawn across the forward-biased base-emitter junction then drift and diffuse across base region 20, under the electric field present within base region 20, and are swept across the collector-base junction and conducted out to collector electrode C.

As known in the art for heterojunction bipolar transistors, the germanium and carbon material in heterojunction base region 20 alters the energy gap of the base of transistor 30. This altered energy gap relative to emitter region 25 improves the emitter efficiency of transistor 30, increasing gain as a result of the higher emitter current produced for a given base-emitter bias. In addition, it is contemplated that the concentration of the non-silicon material in base region 20 will vary with the distance from the emitter junction, establishing a built-in electric field within base region 20 that assists the drift of minority carriers through base region 20 to collector 28, which in turn improves the switching performance of the device (i.e., raising the cutoff frequency $f_T$).

Referring now to FIGS. 3a through 3i, the construction of heterojunction bipolar transistor 30 according to the preferred embodiment of the invention will now be described. This method of construction will be equally applicable to bipolar transistors of either conductivity type (i.e., NPN or PNP), as will be apparent from this description. In addition, it will be apparent to those skilled in the art that MOS transistors may be formed elsewhere in the integrated circuit simultaneously with the fabrication of transistor 30, with many of the same steps performed in common.

Figure 3A:
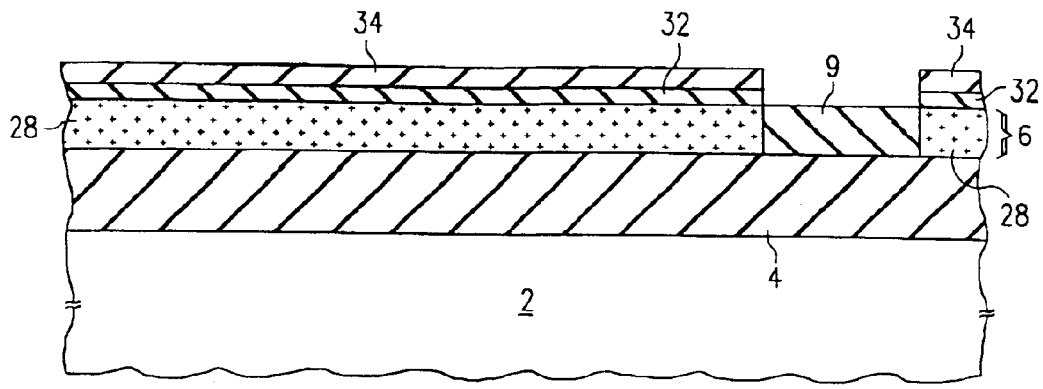
FIGS. 3a through 3i are cross-sectional views illustrating the formation of the heterojunction bipolar transistor of FIG. 1 according to the preferred embodiment of the invention.

As shown in FIG. 3a, silicon thin film layer 6 is disposed over buried insulator layer 4. This structure may be fabricated by any one of a number of technologies. These technologies include the wafer bonding approach, in which two single-crystal silicon wafers are bonded to one another on either side of a silicon oxide layer, to result in single-crystal layers on either side of the insulator layer. According to another approach, referred to in the art as SIMOX, a single crystal silicon wafer is implanted with oxygen ions, so that a high concentration of oxygen is present at a selected depth within the wafer. The oxygen is thermally reacted with the silicon to form a buried oxide layer about the depth of implantation. These and other conventional techniques for fabricating an SOI structure are suitable for use in connection with this invention. Preferably, the oxygen content in buried insulator layer 4 is sufficient low to avoid the necessity of a gettering procedure.

In this example, silicon thin film layer 6 is significantly thinner than buried insulator layer 4. For example, buried insulator layer 4 is preferably on the order of 0.5 to 1.0 $\mu$m in thickness, while silicon thin film layer 6 is on the order of 100 to 120 nm thick. Handle wafer 2 is significantly thicker, for example on the order of 625 $\mu$m thick. In this example, silicon thin film layer 6 is single-crystal silicon of either the <100> or <110> crystal orientation. Silicon thin film layer 6 is also preferably intrinsic as formed, to facilitate doping to the appropriate concentration for both NPN and PNP devices. Alternatively, if only one type (PNP or NPN) of transistor is being formed silicon thin film layer 6 may be doped to the appropriate concentration for that transistor type.

Masked implants are then applied to the SOI structure, to define n-type and p-type regions within silicon thin film layer 6, for example corresponding to the n-wells and p-wells of MOS transistors to be formed within silicon thin film layer 6. As noted above, if only one transistor type is being fabricated and doped starting material is being used, a masked implant may not be necessary. Typically, the masked implants are performed through a thin screen oxide (e.g., 10 to 20 nm of thermal oxide), to avoid channeling. Masking for the ion implants will typically be effected by photolithographically patterned photoresist or oxide. A post-implant anneal is performed in the usual manner, to diffuse and activate the implanted species.

Following these masked implants and anneal, trench isolation structures 9 are formed to provide device-to-device isolation. According to this embodiment of the invention, silicon dioxide film 32 is first deposited, for example by chemical vapor deposition (CVD) based on the decomposition of tetraethylorthosiliciate (TEOS), to a thickness on the order of 15 to 20 nm. Silicon nitride film 34 is then deposited over silicon dioxide film 32, for example by low pressure CVD (LPCVD) to a thickness of on the order of 200 to 300 nm, and both insulator films are photolithographically patterned to define the locations at which trench isolation structures are formed. Using films 32, 34 as a mask, silicon thin film layer 6 is then plasma etched through to insulating layer 4 at the exposed locations. Silicon dioxide is then deposited into the etched locations after a standard etch clean, for example by way of atmospheric pressure CVD (APCVD), is densified by a high temperature anneal in a wet oxygen ambient, and is planarized by chemical mechanical polishing (CMP), resulting in trench isolation structures 9 as shown in FIG. 3a.

Figure 3B:
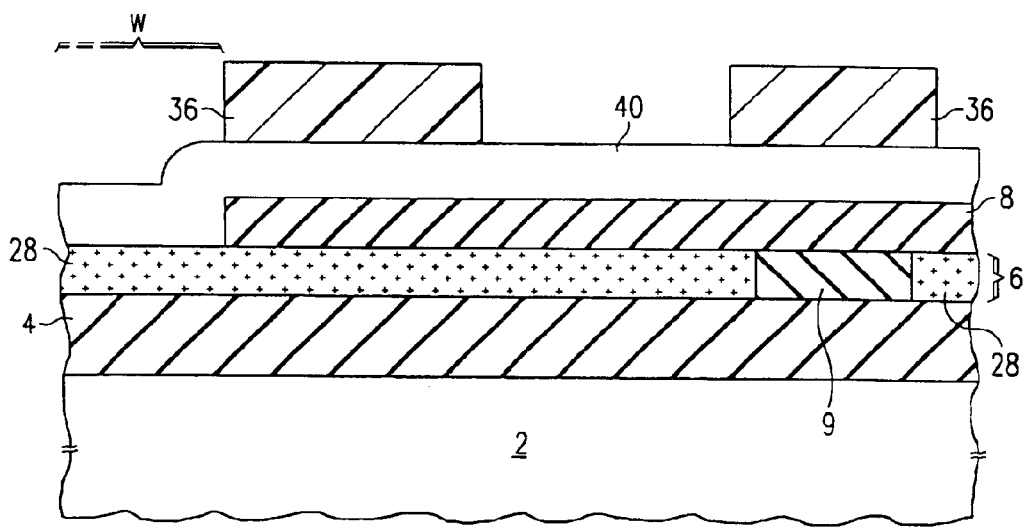

Following the formation of trench isolation structures 9, referring to FIG. 3b, insulator film 8 is then formed overall. Insulator film 8 preferably includes a thin thermal oxide grown from silicon thin film layer 6, for example to a thickness of 10 to 20 nm, followed by the deposition of a CVD oxide, for example from TEOS decomposition, to a thickness of on the order of 200 to 300 nm. An opening is then plasma etched through insulator film 8, at photolithographically defined location W, as shown in FIG. 3b. In the region at which transistor 30 is being formed, silicon thin film layer 6 is doped by ion implantation, to the concentration desired to form selective-implanted collector 28. As typical for NPN bipolar transistors, collector region 28 will be relatively lightly-doped n-type. The process will be repeated to form p-type selective-implanted collectors, if complementary bipolar devices are being formed in the same integrated circuit. Following the implant, a thermal anneal is performed to diffuse the implanted species and anneal out any implant damage.

Once the collector region 28 of silicon thin film layer 6 is implanted and annealed, polysilicon layer 40 is deposited overall, for example to a thickness of 200 to 300 nm, as shown in FIG. 3b. Photoresist is then dispensed overall, and photolithographically patterned, to define mask portions 36 at the locations of base electrodes and other polysilicon elements; it is contemplated that gate electrodes may be simultaneously defined in the MOS locations (not shown). The structure at this point of the manufacture is illustrated in FIG. 3b.

Polysilicon layer 40 of the structure is then anisotropically etched at the locations exposed by mass portions 36. This etch is then followed by an etch of insulator film 8, clearing to the surface of silicon thin film layer 6, resulting in the structure illustrated in FIG. 3c. These etches are preferably plasma etches. The anisotropic etch of this polysilicon layer 40 results in polysilicon base electrode 10 having a sidewall filament 10f at those locations of polysilicon film that make a step over the windows W in insulator film 8, because polysilicon layer 40 is thicker, in the vertical direction, at those locations. As will be described in further detail below, filament 10f will be the base link between heterojunction base region 20 (FIG. 1) formed in silicon thin film layer 6 and base polysilicon electrode 10. The length of polysilicon layer 40 away from filament 10f defines the length of collector region 28, considering that collector polysilicon plug 24c will be located substantially adjacent to this end of polysilicon base electrode 10. This length is defined by the size of mask portion 36, and is selected according to the desired tradeoff between breakdown voltage and collector resistance in transistor 30.

Figure 3C:
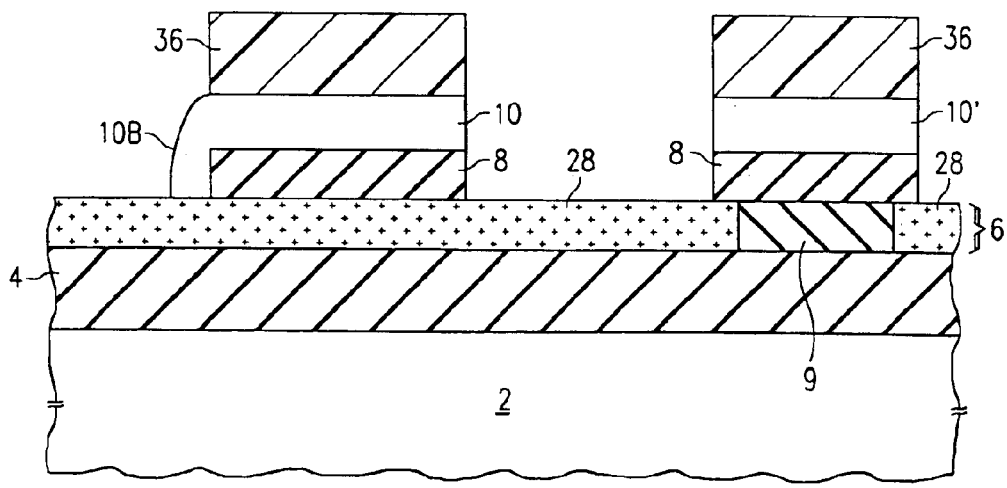

Also as shown in FIG. 3c, unrelated polysilicon conductor 10' is defined by this anisotropic etch; no filament is present, however, because this location of mask portion 36 is not in proximity to a step of poylsilicon layer 40 over the edge of insulating film 8.

Figure 3D:
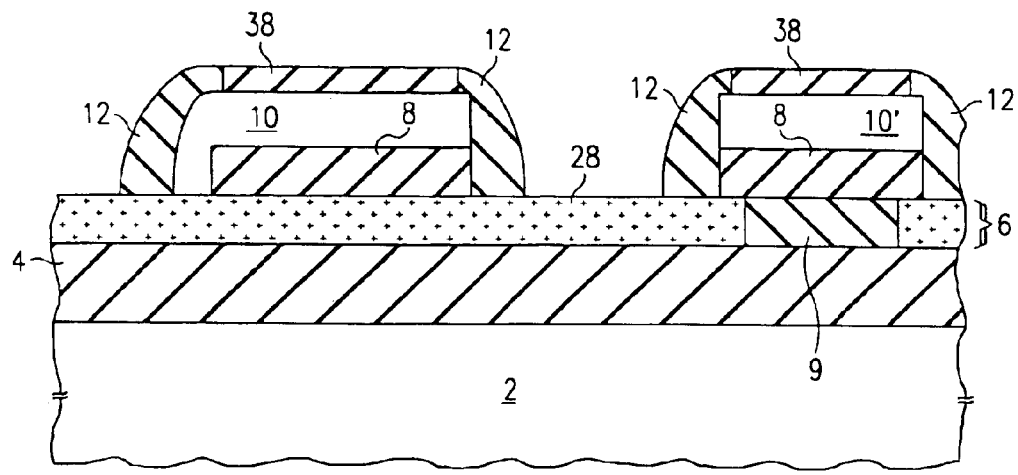

Polysilicon electrodes 10, 10' are then insulated as shown in FIG. 3d. According to the preferred embodiment of the invention, insulator layer 38 is deposited over the structure of FIG. 3c, for example by way of CVD of TEOS silicon dioxide, to a thickness on the order of 20 to 50 nm. Insulator film 38 is then removed from all locations other than from atop base polysilicon electrode 10 and polysilicon electrode 10', by a masked isotropic etch, resulting in the capping of polysilicon electrodes 10, 10' by insulating film 38 as shown in FIG. 3d. Another insulating film is then formed overall, for example by a short thermal oxidation of exposed silicon, for example to a thickness of 4 to 10 nm, followed by the CVD of TEOS silicon dioxide to a thickness of on the order of 120 nm. An anisotropic plasma etch is then performed, removing this second insulating film from the entire surface except at the edges of capped polysilicon electrodes 10, 10', leaving insulating sidewall filaments 12 as shown in FIG. 3d.

Figure 3E:
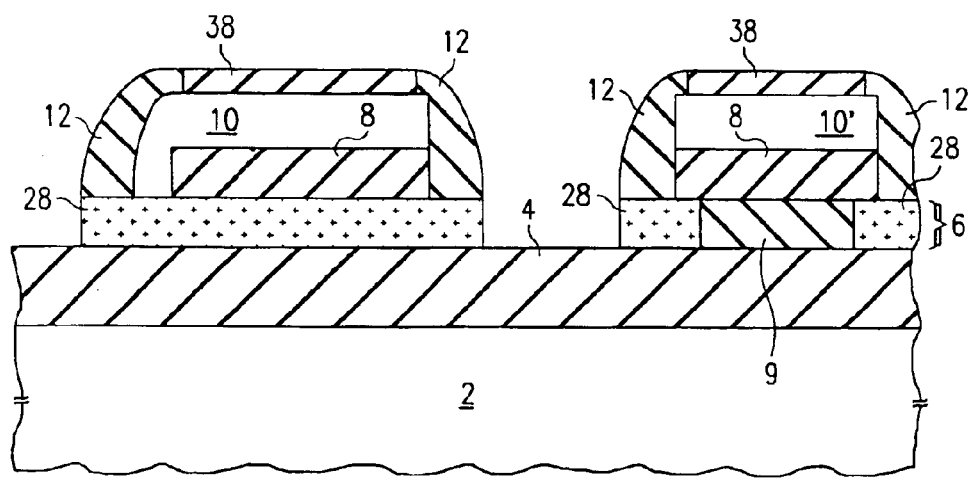

The structure is then subjected to a silicon plasma etch, to remove exposed portions of silicon thin film layer 6, using insulating sidewall filaments 12 and insulator film 38 as a mask and using buried insulator layer 4 as an etch stop. The resulting structure is shown in FIG. 3e. Because this etch is anisotropic, undercut of silicon thin film layer 6 is minimized.

Figure 3F:
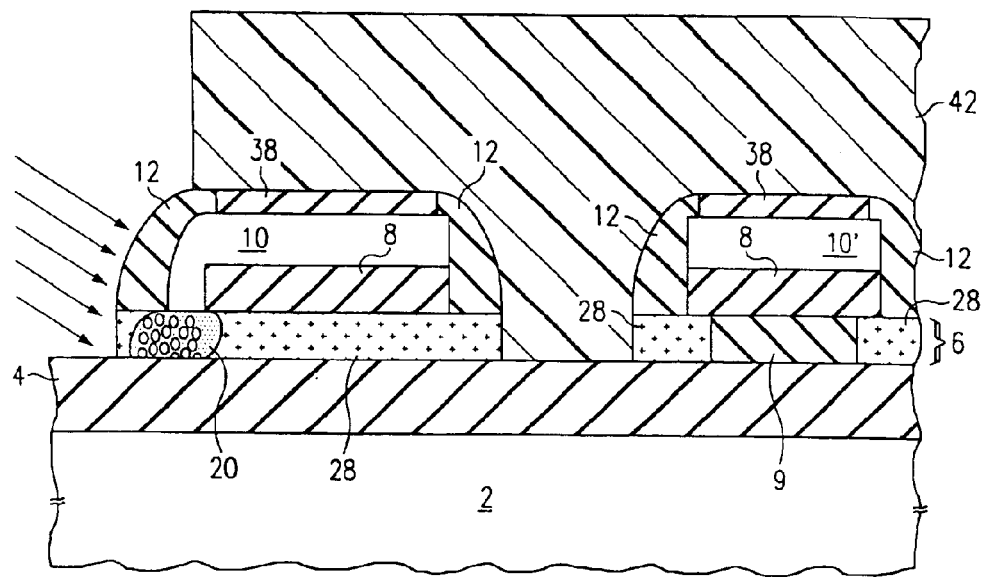

Referring now to FIG. 3f, photoresist is then dispensed overall, and photolithographically patterned to form photoresist mask 42 to mask the ion implant used to form heterojunction base region 20. As shown in FIG. 3f, photoresist mask 42 protects polysilicon electrodes 10, 10', and many edges of silicon thin film layer 6, but exposes the edge of silicon thin film layer 6 at which sidewall filament 10f of base polysilicon electrode extends to make contact to collector 28. This edge of silicon thin film layer 6 thus receives an ion implant of the heterojunction forming species and also the base dopant species. In this preferred embodiment of the invention, the desired heterojunction material is germanium and carbon, forming heterojunction base region 20 of Si—Ge—C. As such, the base implant includes ions of germanium, carbon, and boron for the formation of NPN transistor 30; conversely, for the formation of a PNP transistor, the implant would include ions of germanium, carbon, and phosphorous (or an alternative n-type dopant). It is further contemplated that complementary bipolar transistors may be formed in the same integrated circuit, in which case photoresist mask 42 would be patterned to protect the base regions of NPN transistors from the germanium, carbon, and phosphorous base implant for the PNP devices, and a second photoresist mask would be patterned to protect the base regions of PNP transistors from the germanium, carbon, and boron base implant for the NPN devices.

The doses and energies of the base implant of the base dopant are selected to ensure that the implanted species reaches the location under base sidewall filament 10f, and at a distance away from the exposed edge of silicon thin film layer 6 to allow room for the formation of an active emitter, as will be discussed below. In addition, the base implant is preferably angled (i.e., not perpendicular to the surface), as suggested by FIG. 3f, for example at a 45° angle from the normal, so that the implanted species enter silicon thin film layer 6 from the edge. The top of the exposed portion of silicon thin film layer 6 is protected by insulating sidewall filaments 12, as shown in FIG. 3f. An example of a contemplated base implant according to this embodiment of the invention includes a germanium implant of 1E15 cm$^{-2}$ at about 200 keV, a carbon implant of 1E15 cm$^{-2}$ at about 30 to 50 keV, and a boron (BF$_2$) implant of 1E13 cm$^{-2}$ at about 10 to 20 keV. For PNP devices, an example of the base dopant implant would implant phosphorous at about 1E15 cm$^{-2}$ at about 10 to 12 keV.

The order of the heterojunction and intrinsic base implants may be arranged for efficiency, and depending on whether complementary transistors are being formed. For example, the germanium and carbon implants may be simultaneously applied to base regions of both NPN and PNP devices, followed by an anneal, prior to the separate implanting of the n-type and p-type intrinsic base implants into the PNP and NPN device locations. This order may be preferable in order to permit the implanted carbon ions to reduce dopant diffusivity of boron and phosphorous, providing additional control of the base formation.

In any event, an anneal is performed after all implants are performed, to anneal out implant damage and to diffuse the implanted species as desired. The resulting structure, as shown in FIG. 3f for the example of NPN transistor 30, includes p-type heterojunction base region 20, where the heterojunction is of the Si/Ge$_x$C$_y$Si$_{1-x-y}$/Si type. It is also contemplated that heterojunction base region 20 will be graded, to some extent, from the standpoint of the germanium-silicon doping, so that a built-in electric field within the base region will be established under typical bias, assisting the minority carrier drift and thus providing a very high cutoff frequency and excellent switching performance.

Figure 3G:
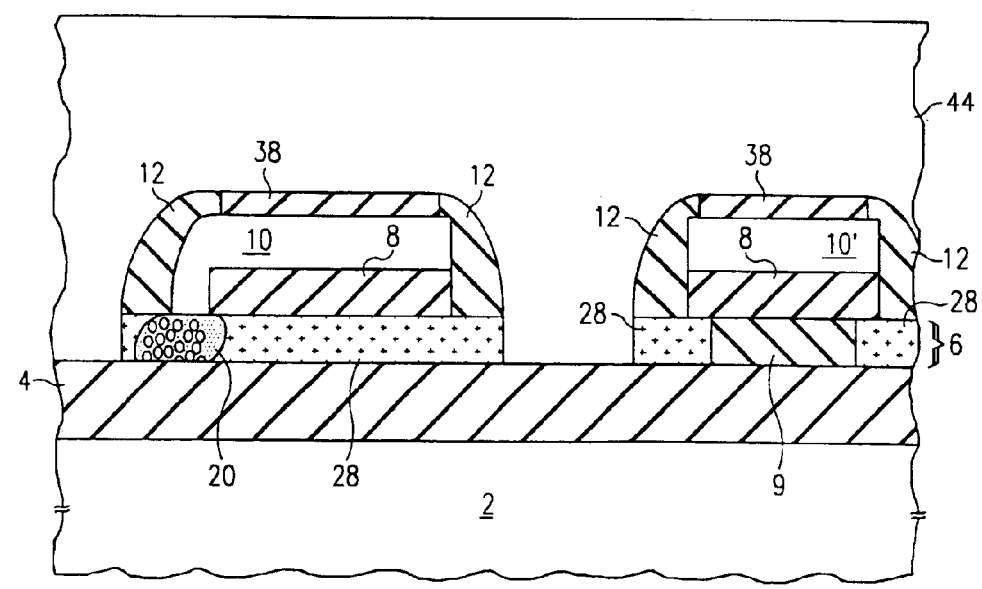
Figure 3H:
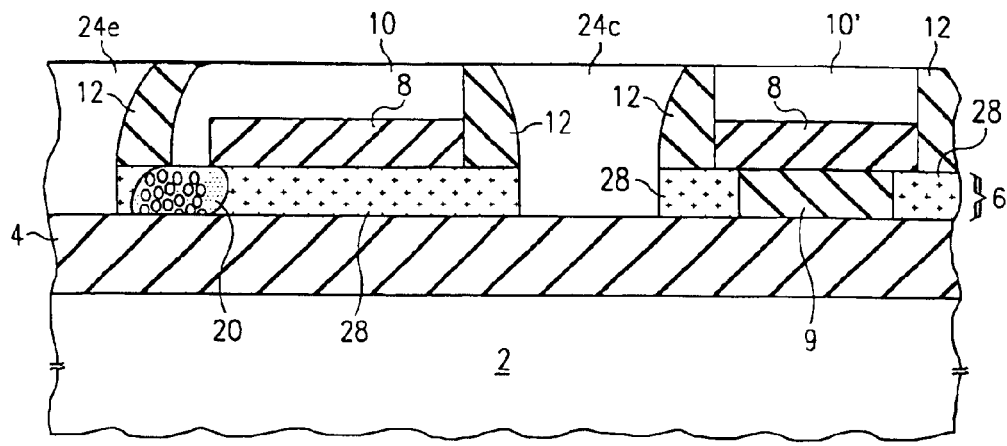

Referring now to FIG. 3g, polysilicon layer 44 is deposited overall. This deposition is preferably preceded by a wet oxide strip, to ensure that the edges of silicon thin film layer 6 are sufficiently clean to provide good physical and electrical contact with polysilicon layer 44; this etch should be kept brief to minimize undercut. Following polysilicon deposition, etchback of polysilicon layer 44, insulating film 38, and insulator sidewalls 12 is performed to define collector polysilicon plug 24c and emitter polysilicon plug 24e, and to expose the top surfaces of polysilicon electrodes 10, 10' as shown in FIG. 3h. This etchback may be a wet chemical or a plasma etch, or alternatively may be performed by CMP.

Figure 3I:
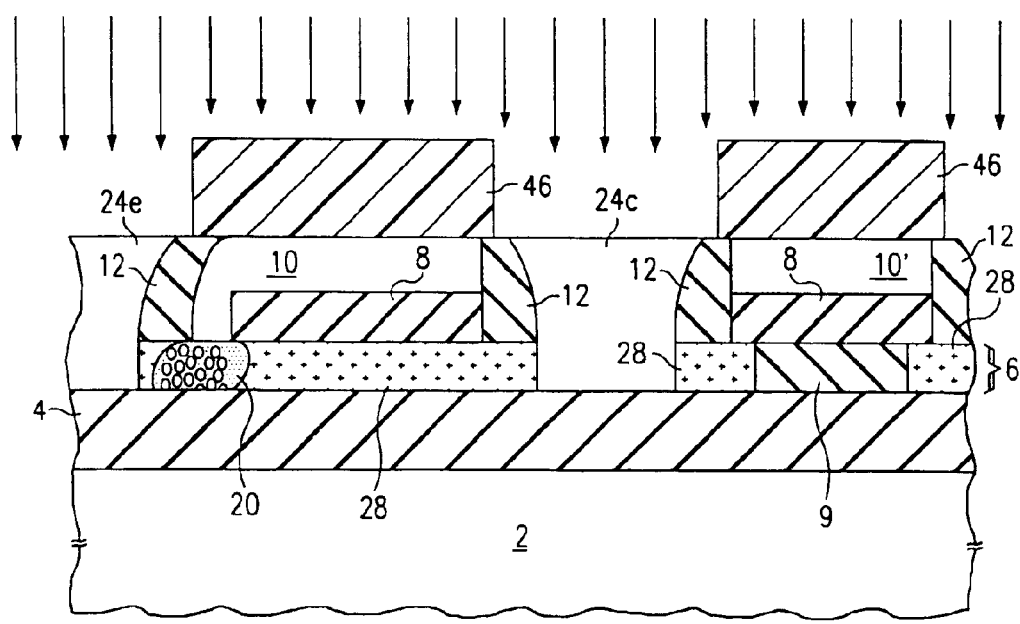

Polysilicon plugs 24c, 24e are then doped by masked ion implantation, as shown in FIG. 3i. A thin (20 to 50 nm) screen oxide may first be grown at the surface of polysilicon plugs 24, if desired, to prevent channeling. Mask 46, preferably patterned photoresist, protects base polysilicon electrode 10 from this implant, considering that base polysilicon electrode 10 is of opposite conductivity type from the dopant of polysilicon plugs 24c, 24e. For the formation of NPN transistor 30, an example of the implant is an arsenic or phosphorous at a dose of on the order of 1E15 cm$^{-2}$ at an energy of from 10 to 120 keV; for the formation of a PNP device, the implant species will of course be boron. If the thermal budget of the process is limited, it may be preferable to perform a rapid thermal anneal of the structure prior to implant to break up any interfacial oxide within polysilicon plugs 24. If complementary devices are to be formed, n-type areas are masked, and a p-type implant of the corresponding collector and emitter polysilicon plugs 24 for the PNP devices is performed. Further in the alternative, in the formation of complementary structures, the base polysilicon electrode for devices of one type may be exposed to the implant of the collector and emitter polysilicon plugs for device of the other conductivity type, improving the conductivity of those structures.

This implant of collector and emitter polysilicon plugs 24 may also be simultaneously applied to polysilicon elements (e.g., unrelated polysilicon electrode 10') to form low resistivity polysilicon resistors, capacitor plates, and other structures.

Referring back to FIG. 1, the completion of transistor 30 according to this embodiment of the invention will now be described. Following the polysilicon implants, an anneal is performed to diffuse dopant from emitter polysilicon plug 24e into silicon thin-film layer 6, at the location adjacent to heterojunction base region 20, to form active emitter region 25, as shown in FIG. 1. Dopant from implanted collector polysilicon plug 24c will also diffuse into its adjacent portions of silicon thin film layer 6, forming subcollectors 22. Any screen oxide in place over polysilicon plugs 24 and polysilicon electrodes 10 is then stripped by a wet etch. Silicide cladding 26 may then be formed, preferably by way of a conventional direct react process, in which the siliciding metal (e.g., titanium) is deposited in elemental form and then reacted with the exposed surfaces of polysilicon plugs 24 and polysilicon electrodes 10; unreacted siliciding metal, such as overlying the insulating sidewalls 12, is then readily removed by a conventional etch. The result of this processing is transistor 30, as shown in FIG. 1.

Following the fabrication of transistor 30, conventional metallization processes are then performed to provide the desired electrical connection to the elements of transistor 30. As is well known in the art, such conventional metallization is constructed by the deposition of thick insulator films, the formation of contacts or vias, and the deposition and patterning of metal conductor films and plugs, in the conventional manner.

This invention provides important advantages in the formation of high performance transistors. An important benefit of this invention is the ability to form a heterojunction bipolar transistor, and obtaining the gain advantage of such a device, without necessitating the expensive epitaxial processes that are conventionally used for heterojunction devices, and without the performance degradation that plagues the conventional formation of implanted heterojunction bipolar devices. The heterojunction bipolar process of this invention is also accomplished with a reduced mask count from conventional processes. It is contemplated that the resulting heterojunction devices will have high switching performance, and enhanced Early voltage, at very low current densities relative to conventional SOI BiCMOS and conventional bulk technologies. The high switching performance is contemplated to be provided by both the graded profile of the heterojunction material within the base region, establishing a built-in electric field within the base region under typical bias, and also because of the greatly reduced parasitic capacitance provided by the silicon-on-insulator (SOI) structure, considering the absence of the collector-substrate junction.

In addition, the heterojunction devices of this invention are formed in SOI structures in which the silicon film is quite thin. As a result, the heterojunction bipolar fabrication process is compatible with conventional thin-film SOI MOS processes, making this invention especially attractive for BiCMOS and complementary BiCMOS (CBiCMOS) integrated circuits.

The devices constructed according to this invention have additional advantages. It is contemplated that the base resistance for this device is intrinsically low, which provides higher frequency power performance than conventional vertical heterojunction bipolar junction transistors. In addition, the lateral collector/plug contact scheme eliminates the need for a highly doped buried layer, which can cause problems when epitaxial deposits are used in a standard vertical transistor.

While the present invention has been described according to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

We claim:

1. A bipolar transistor in an integrated circuit, formed in a single-crystal semiconductor layer disposed over an insulating layer, comprising:
    a heterojunction base region disposed in the semiconductor layer;
    an intrinsic emitter region disposed in the semiconductor layer adjacent to the heterojunction base region;
    a collector region disposed in the semiconductor layer adjacent to the heterojunction base region;
    a polysilicon base electrode overlying at least a portion of the collector region, and having a filament contacting the heterojunction base region;
    an insulating film disposed between the polysilicon base electrode and the portion of the collector region underlying the polysilicon base electrode;
    an emitter plug contacting the intrinsic emitter region; and
    a collector plug contacting the collector region.

2. The transistor of claim 1, wherein the semiconductor layer is formed of single-crystal silicon;
    and wherein the heterojunction base region of the semiconductor layer further comprises germanium.

3. The transistor of claim 2, wherein the heterojunction base region further comprises carbon.

4. The transistor of claim 1, further comprising:
    a first insulating filament disposed between the filament of the polysilicon base electrode and the emitter plug; and
    a second insulating filament disposed between the polysilicon base electrode and the collector plug.

5. The transistor of claim 1, wherein the emitter plug comprises doped polysilicon.

6. The transistor of claim 5, wherein the collector plug comprises doped polysilicon.

7. The transistor of claim 1, further comprising:
    a trench isolation structure, disposed adjacent a portion of the semiconductor layer.

* * * * *